United States Patent
Horiuchi

(10) Patent No.: US 7,645,943 B2
(45) Date of Patent: Jan. 12, 2010

(54) CONFIGURABLE PRINTED CIRCUIT BOARD

(75) Inventor: Jason R. Horiuchi, Hewitt, TX (US)

(73) Assignee: Delphi Technologies, Inc., Troy, MI (US)

( * ) Notice: Subject to any disclaimer, the term of this patent is extended or adjusted under 35 U.S.C. 154(b) by 91 days.

(21) Appl. No.: 11/827,442

(22) Filed: Jul. 11, 2007

(65) Prior Publication Data

US 2009/0017647 A1 Jan. 15, 2009

(51) Int. Cl.
*H01R 12/04* (2006.01)
*H05K 1/11* (2006.01)

(52) U.S. Cl. ...................... 174/261; 174/262
(58) Field of Classification Search .......... 174/250, 174/261, 262, 266
See application file for complete search history.

(56) References Cited

U.S. PATENT DOCUMENTS

| | | | | |
|---|---|---|---|---|
| 3,923,359 A | * | 12/1975 | Newsam | 439/75 |
| 4,538,878 A | * | 9/1985 | Dambach et al. | 439/742 |
| 4,838,800 A | * | 6/1989 | Lynch | 439/78 |
| 5,112,230 A | * | 5/1992 | DeSimone | 439/55 |
| 5,310,353 A | | 5/1994 | Parrish et al. | |
| 5,513,077 A | | 4/1996 | Stribel | |
| 5,537,295 A | | 7/1996 | Van Den Bout et al. | |
| 6,699,067 B1 | | 3/2004 | Zhao et al. | |
| 7,030,712 B2 | | 4/2006 | Brunette et al. | |
| 2003/0147221 A1 | | 8/2003 | Blasko et al. | |
| 2005/0282314 A1 | | 12/2005 | Lo et al. | |

FOREIGN PATENT DOCUMENTS

GB 2030007 3/1980

* cited by examiner

*Primary Examiner*—Ishwar (I. B.) Patel
(74) *Attorney, Agent, or Firm*—Thomas N. Twomey

(57) ABSTRACT

A configurable printed circuit board can be used with a bussed electrical center in a vehicle and has a dielectric body. The dielectric body defines an array of plated through-holes that are constructed to receive a terminal of an electrical adaptor. A conductive trace is also adhered to a surface of the dielectric body and is routed through some of the plated through-holes for carrying current between them. An aperture is defined through a portion of some of the plated through-holes and the respective conductive traces to electrically isolate one side of the conductive trace from another side; and thus the printed circuit board can accommodate more than one electrical device in a single section.

8 Claims, 1 Drawing Sheet

CONFIGURABLE PRINTED CIRCUIT BOARD

FIELD OF THE INVENTION

This invention relates generally to bussed electrical centers (BECs), and more particularly to printed circuit boards (PCBs) used in BECs.

BACKGROUND OF THE INVENTION

Bussed electrical centers are commonly used in vehicles to package various electrical devices such as fuses, relays, and the like, in a central location. Some of the electrical devices, in turn, carry power to a vehicle's lights, horns, radios, and other components. Oftentimes, PCBs are provided as part of the BECs. Because a single design of a BEC is ordinarily used for a vehicle platform with different vehicle models (each having different electrical devices), the accompanying PCB has traditionally been designed with an unshared section to accommodate each of the different electrical devices, whether or not a particular electrical device is used in a particular vehicle model. This type of design can call for a larger PCB, and thus a larger BEC. Moreover, this is true even with two mutually exclusive electrical devices; meaning that if a BEC has one of the electrical devices, it does not have the other.

SUMMARY OF THE INVENTION

One embodiment of the invention may include a configurable printed circuit board having a dielectric body that defines an array of plated through-holes. The printed circuit board also has a conductive trace adhered to a surface of the dielectric body for carrying current. And the printed circuit board has an aperture defined through a portion of some of the plated through-holes and the conductive trace to electrically isolate one side of the conductive trace from another side.

Another embodiment of the invention may include a method of configuring a printed circuit board with a section that interchangeably receives different electrical devices of a bussed electrical center. The method includes providing a circuit board dielectric body that defines an array of plated through-holes, and providing a plurality of conductive traces adhered to a surface of the body and being routed through and between two or more of the plated through-holes. The method further includes cutting an aperture completely through a portion of the two or more plated through-holes and the conductive trace such that one side of the conductive trace is electrically isolated from another side by the aperture.

Another embodiment of the invention may include a configurable printed circuit board for use with a bussed electrical center in a vehicle. The printed circuit board has a dielectric body with a surface and an array of plated through-holes. The printed circuit board also has a plurality of conductive traces that are routed around a periphery of two or more plated through-holes to form a first branch and a second branch. The printed circuit board further has a first hole and a second hole, each defined completely through respective portions of the two or more plated through-holes. The first and second holes each electrically isolate one side of the conductive trace from another side.

DETAILED DESCRIPTION OF THE PREFERRED EMBODIMENTS

Referring in more detail to the drawings, FIGS. 1-4 show one embodiment of a printed circuit board (PCB) 10 that can be used as one component of a bussed electrical center (BEC) assembly in an automobile, or other electrical assemblies. The PCB 10 is designed to be configurable in the sense that the PCB can accommodate more than one mutually exclusive electrical device in a single section. Each electrical device thus need not have its own unshared section designated in the PCB 10 so that the overall size of the PCB can be reduced. To do so, the PCB 10 has a dielectric body 12 that defines an array of plated through-holes 14 for receiving the various electrical devices; the PCB also has a plurality of conductive traces 16 routed through the plated through-holes for carrying current therebetween; and the PCB defines an aperture 18 cut through at least some of the plated through-holes and through the adjacent conductive trace for isolating one side of the conductive trace from another side.

Figure 1:
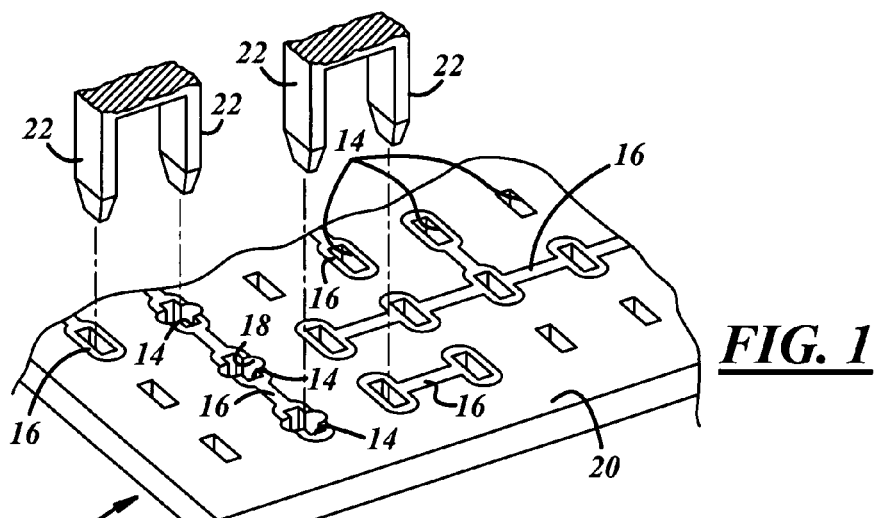
FIG. 1 is an enlarged fragmentary view of an embodiment of a printed circuit board receiving a single terminal blade.
Figure 2:
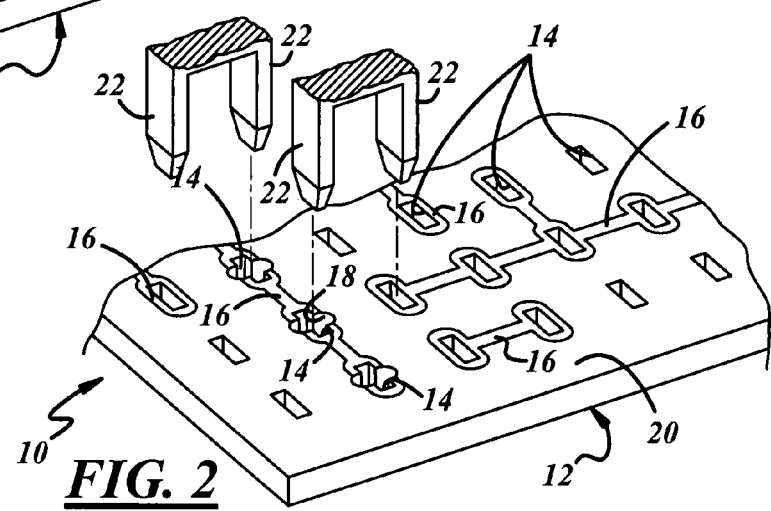
FIG. 2 is an enlarged fragmentary view of the printed circuit board of FIG. 1 receiving a pair of terminal blades.

Referring to FIGS. 1 and 2, the dielectric body 12 provides connections for the electrical devices and routes electric current to them. The dielectric body 12 may be made out of a flat board of nonconductive material, such as an organic resin reinforced by fibers or the like. The dielectric body 12 has a surface 20 and defines the array of plated through-holes 14. As shown, the plated through-holes 14 can be arranged in rows and columns to pattern a standard terminal footprint such as the 280 relay footprint of the Society of Automotive Engineers standard SAE J1744. Each of the plated through-holes 14 is constructed to receive a terminal such as a terminal blade 22 of an electrical adaptor, like a tuning fork, that can in turn receive the electrical devices. The plated through-holes 14 can be fitted in holes which can be cut completely through the dielectric body 12 in a cylindrical or rectangular shape. The plated through-holes 14 may be composed of a conductive material such as copper, a copper alloy, a brass alloy, or the like that can provide an electrical connection between the terminal blade 22 and the plated through-holes. A capture pad 24 (FIGS. 3 and 4) can be lipped over a periphery of each plated through-hole 14 to electrically connect the plated through-hole to the conductive trace 16.

Figure 3:
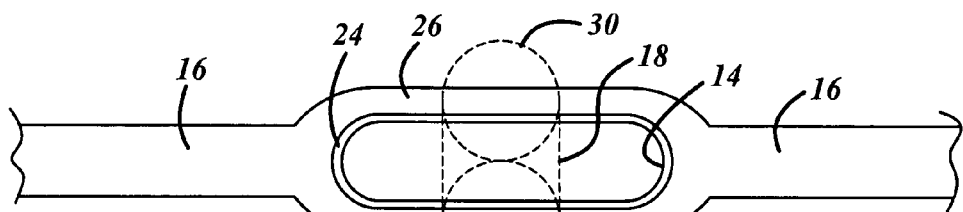
FIG. 3 is an enlarged isolated view of a plated through-hole and a conductive trace of the printed circuit board of FIG. 1.

Still referring to FIGS. 1 and 2, the conductive traces 16 can be adhered to the surface 20 of the dielectric body 12 to carry current from a power source, such as a battery, and to the electrical devices connected to the terminal blades 22. Although only shown on the surface 20, a plurality of conductive traces can be layered within the dielectric body 12 as will be known by those persons skilled in the art. The conductive traces 16 may be composed of a conductive material such as copper foil and are routed between a number of plated through-holes 14 in a generally unidirectional layout as shown, or with multiple turns throughout its layout. The exact layout is dictated by, among other things, the connection required by the electrical devices. Referring to FIG. 3, the conductive traces 16 are routed around each of the plated through-holes to define a first branch 26 and a second branch 28. Current can be carried through each branch.

Figure 4:
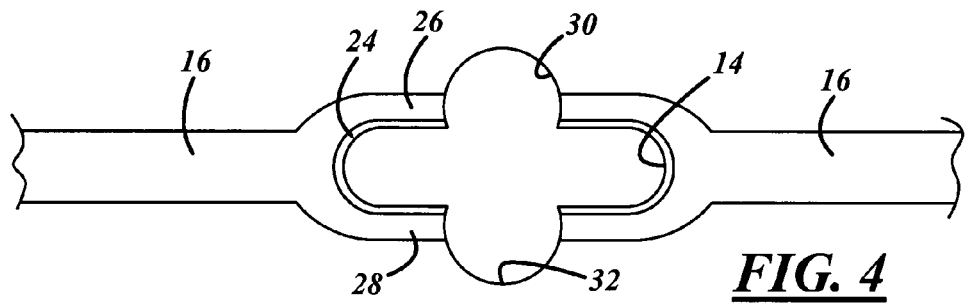
FIG. 4 is an enlarged isolated view of the plated through-hole and conductive trace of FIG. 3 with an aperture cut through them.

Referring now to FIGS. 3 and 4, the aperture 18 electrically isolates one side of the conductive trace 16 from another side such that no current can travel therethrough forming an open circuit thereat. The aperture 18 cuts completely through a portion of the plated through-hole, completely through the conductive trace 16, and may also cut completely through the dielectric body 12. The aperture 18 can be cut by a tool forming a single oval that traverses both the first branch 26 and the second branch 28 as shown in phantom in FIG. 3, can be cut by a tool forming a pair of circles as also shown in phantom, or can be cut in other shapes not shown. In the case of the pair of circles, a first hole 30 is cut through a portion of the first branch 26, and a second hole 32 is cut through a portion of the second branch 28. In any case, the aperture 18 can be formed by removing material with a metal working operation such as punching with a punch press, drilling with a drill, or the like.

When the PCB 10 is designed with the apertures 18, the PCB 10 is suited to accommodate more than one mutually exclusive electrical device in a single section. For example, referring to FIGS. 1 and 2, a section can be designated as the conductive traces 16 shown and the three associated plated through-holes 14 located beneath the terminal blades 22. In FIG. 1, two pair of terminal blades 22 representing two electrical adaptors are inserted into the section for the connection required by the associated electrical devices. Two separate circuits are created by this insertion. The centered aperture 18 that is shown interrupts or cuts-off the conductive trace 16 such that current does not travel past that aperture thus creating two separate circuits. In FIG. 2, on the other hand, two pair of terminal blades 22 are inserted into the section for two electrical adaptors to create a single circuit between the two adaptors. The terminal blades inserted into the plated through-holes 14 having the apertures 18, bridge the respective apertures such that current can travel to the immediately successive plated through-hole encountered by the conductive trace 16.

As described above, the single section can interchangeably accept and provide current to different electrical devices which require different terminal blade connections. Of course the PCB 10 can accommodate electrical devices with more complex connection requirements—thus more terminal blade arrangements—than the exemplary ones described with reference to FIGS. 1 and 2.

It will be readily understood by those persons skilled in the art that the present invention is susceptible of broad utility and application. Many embodiments and adaptations of the present invention other than those described above, as well as many variations, modifications and equivalent arrangements, will be apparent from or reasonably suggested by the present invention and the foregoing description, without departing from the substance or scope of the present invention. Accordingly, while the present invention has been described herein in detail in relation to its preferred embodiment, it is to be understood that this disclosure is only illustrative and exemplary of the present invention and is made merely for purposes of providing a full and enabling disclosure of the invention. The foregoing disclosure is not intended or to be construed to limit the present invention or otherwise to exclude any such other embodiments, adaptations, variations, modifications and equivalent arrangements, the present invention being limited only by the following claims and the equivalents thereof.

I claim:

1. A configurable printed circuit board comprising:
   a dielectric body having a surface and defining an array of plated through-holes, each plated through-hole being constructed to receive a terminal of an electrical device;
   a first conductive trace adhered to the surface and being routed through a first set of plated through-holes;
   an aperture defined completely through a portion of both the first conductive trace at each of the plated through-holes of the first set to electrically isolate different sections of the first conductive trace from one another; and
   a second conductive trace adhered to the surface and being distinct from the first conductive trace and located adjacent the first conductive trace, the second conductive trace being routed through a second set of plated through-holes to carry current among the plated through-holes of the second set, wherein the second conductive trace is free of the apertures;
   wherein, the first conductive trace and the second conductive trace form an electrical connection by having the terminal inserted therein.

2. The printed circuit board of claim 1 wherein the terminal bridges successive isolated sections of the first conductive trace to permit current to travel therebetween when the terminal is inserted in the first conductive trace.

3. The printed circuit board of claim 1 wherein a section of the array comprising the first and second conductive traces is configurable to interchangeably provide current to different electrical devices of a bussed electrical center.

4. The printed circuit board of claim 1 wherein the first and second conductive traces branch around a respective periphery of each plated through-hole to comprise a first branch and a second branch at each plated through-hole.

5. The printed circuit board of claim 4 wherein each aperture comprises a first hole defined through a portion of each first branch and through one side of the respective plated through-hole, and a second hole defined through a portion of each second branch and through an opposite side of the respective plated through-hole.

6. The printed circuit board of claim 1 wherein each aperture is formed by a punching metal working operation.

7. The printed circuit board of claim 1 wherein each aperture is formed by a drilling metal working operation.

8. A configurable printed circuit board as defined in claim 1 further comprising:
   said first conductive trace having two sections extending substantially transverse to a section of said second conductive trace; and
   said through-holes in said respective transverse section of said first and second conductive traces aligns to form an electrical connection between said respective sections of said first conductive trace and said section of said second conductive trace.

* * * * *